(12) United States Patent
Lin et al.

(10) Patent No.: US 10,522,453 B2
(45) Date of Patent: Dec. 31, 2019

(54) SUBSTRATE STRUCTURE WITH FILLING MATERIAL FORMED IN CONCAVE PORTION

(71) Applicant: Siliconware Precision Industries Co., Ltd., Taichung (TW)

(72) Inventors: Chang-Fu Lin, Taichung (TW);
Chin-Tsai Yao, Taichung (TW);
Chun-Tang Lin, Taichung (TW);
Fu-Tang Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 155 days.

(21) Appl. No.: 15/352,856

(22) Filed: Nov. 16, 2016

(65) Prior Publication Data

US 2017/0207161 A1    Jul. 20, 2017

(30) Foreign Application Priority Data

Jan. 19, 2016    (TW) .............................. 105101521 A

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4853* (2013.01); *H01L 21/4857* (2013.01);
(Continued)

(58) Field of Classification Search
CPC ............. H01L 21/4857; H01L 21/4853; H01L 21/563; H01L 24/16; H01L 24/3171; H01L 23/49838; H01L 23/3185; H01L 23/49894; H01L 23/49822; H01L 2924/3841; H01L 2224/81385; H01L 2224/81007; H01L 2224/16227; H01L 2224/81815; H01L 2224/13147; H01L 2224/81191;
(Continued)

(56) References Cited

U.S. PATENT DOCUMENTS 5,943,597 A * 8/1999 Kleffner .................. H01L 24/13
257/737
6,426,556 B1 * 7/2002 Lin ......................... H01L 24/03
257/738

(Continued)

*Primary Examiner* — Mohsen Ahmadi
*Assistant Examiner* — Scott E Bauman
(74) *Attorney, Agent, or Firm* — Mintz Levin Cohn Ferris Glovsky and Popeo, P.C.; Peter F. Corless; Steven M. Jensen

(57) ABSTRACT

Provided is a substrate structure including a substrate body, electrical contact pads and an insulating protection layer disposed on the substrate body, wherein the insulating protection layer has openings exposing the electrical contact pads, and at least one of the electrical contact pads has at least a concave portion filled with a filling material to prevent solder material from permeating along surfaces of the insulating protection layer and the electric contact pads, thereby eliminating the phenomenon of solder extrusion. Thus, bridging in the substrate structure can be eliminated even when the bump pitch between two adjacent electrical contact pads is small. As a result, short circuits can be prevented, and production yield can be increased.

11 Claims, 4 Drawing Sheets

(51) Int. Cl.
  *H01L 21/56* (2006.01)
  *H01L 23/31* (2006.01)
  *H01L 23/00* (2006.01)

(52) U.S. Cl.
  CPC ........ *H01L 21/563* (2013.01); *H01L 23/3185* (2013.01); *H01L 23/49822* (2013.01); *H01L 23/49894* (2013.01); *H01L 24/16* (2013.01); *H01L 2224/13147* (2013.01); *H01L 2224/16227* (2013.01); *H01L 2224/81007* (2013.01); *H01L 2224/81191* (2013.01); *H01L 2224/81385* (2013.01); *H01L 2224/81815* (2013.01); *H01L 2924/3841* (2013.01)

(58) Field of Classification Search
  CPC . H01L 2224/73204; H01L 2224/05011; H01L 2224/05551; H01L 2224/02135; H01L 24/13; H01L 24/03; H01L 23/49811; H01L 2224/10175; H01L 2224/81192; H01L 2224/16238; H01L 2224/16148; H01L 2224/13022; H01L 2224/10156; H01L 2224/10126; H01L 2224/05567; H01L 2224/05557; H01L 24/05; H01L 2224/16147; H01L 2224/10145
  See application file for complete search history.

(56) References Cited

U.S. PATENT DOCUMENTS

| | | | |
|---|---|---|---|
| 7,329,951 B2* | 2/2008 | Daubenspeck | H01L 23/3171 |
| | | | 257/737 |
| 2003/0218249 A1* | 11/2003 | Ho | H01L 21/563 |
| | | | 257/737 |
| 2007/0281389 A1* | 12/2007 | Shih | H01L 21/4853 |
| | | | 438/106 |
| 2013/0147031 A1* | 6/2013 | Chen | H01L 24/11 |
| | | | 257/737 |
| 2015/0348923 A1* | 12/2015 | Wang | H01L 24/05 |
| | | | 257/774 |
| 2017/0005052 A1* | 1/2017 | Chen | H01L 24/13 |
| 2017/0098627 A1* | 4/2017 | Das | H01L 25/0657 |

* cited by examiner

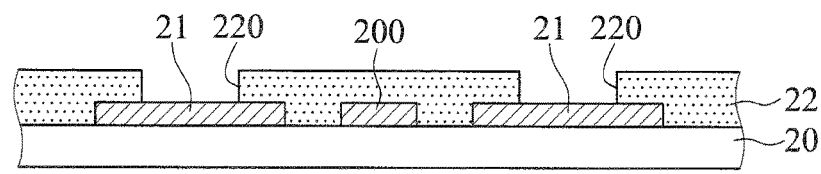
FIG.2A
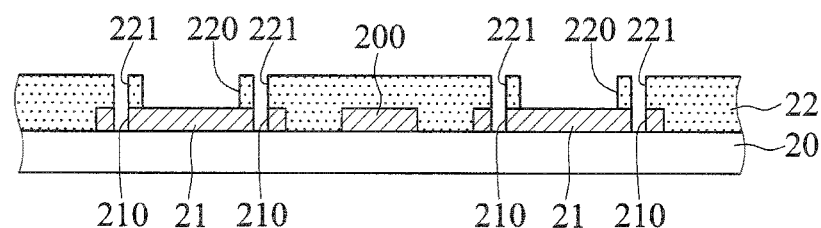
FIG.2B
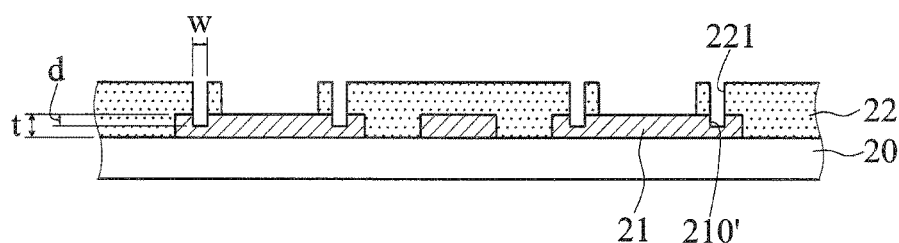
FIG.2B'
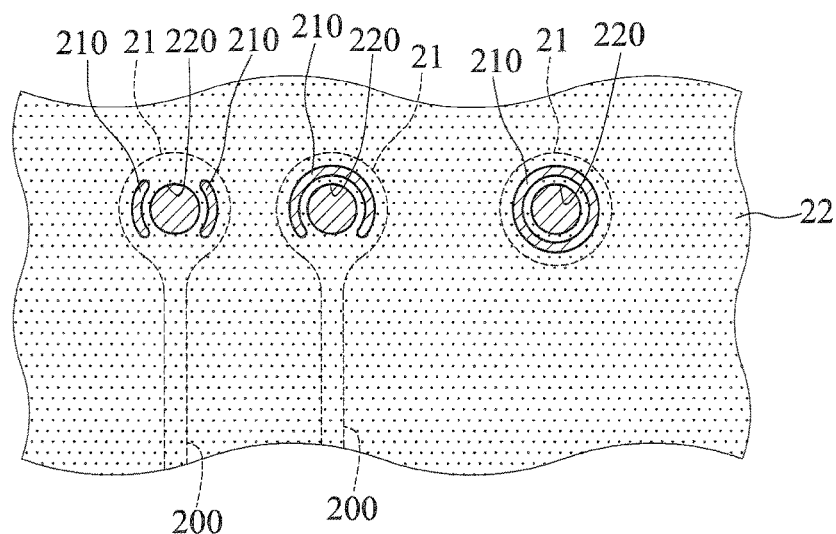
FIG.2B"

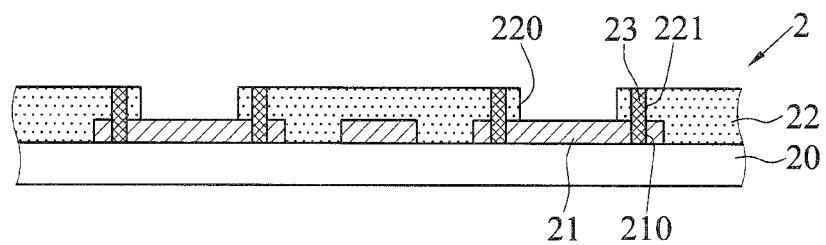
FIG.2C
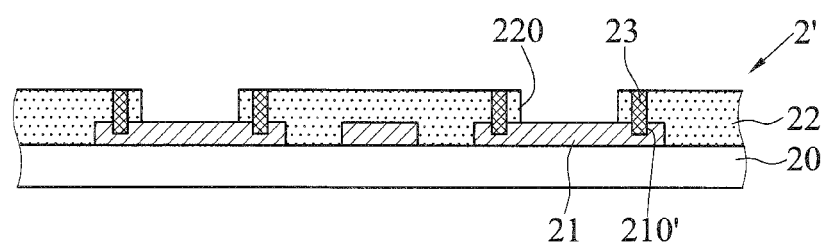
FIG.2C'
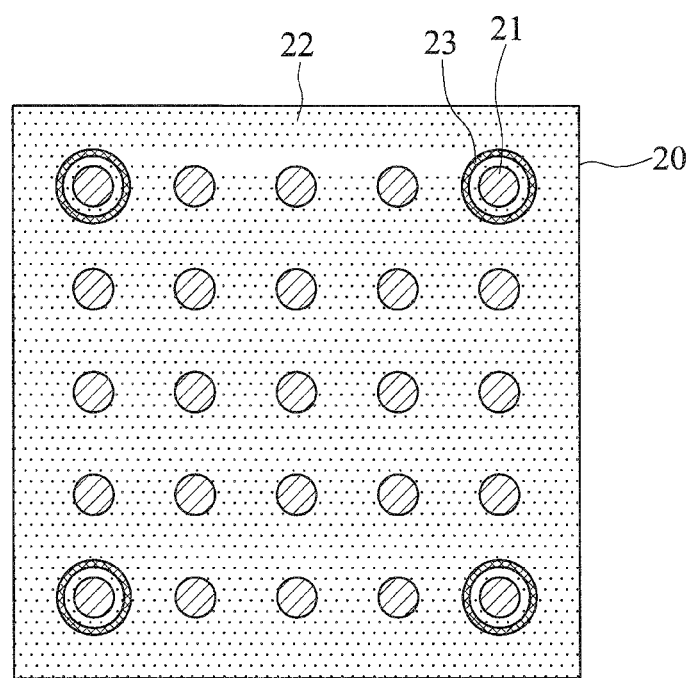
FIG.2C"

SUBSTRATE STRUCTURE WITH FILLING MATERIAL FORMED IN CONCAVE PORTION

CROSS-REFERENCE TO RELATED APPLICATION

This application claims under 35 U.S.C. § 119(a) the benefit of Taiwanese Patent Application No. 105101521 filed Jan. 19, 2016, the entire contents of which are incorporated herein by reference.

TECHNICAL FIELD

The present disclosure relates to a substrate structure, and more particularly, to a substrate structure and a method for manufacturing the same that increase the production yield.

BACKGROUND

With the evolution of semiconductor packaging technology, semiconductor devices have developed different types of packaging. Among which, ball grid array (BGA), such as PBGA, EBGA, FCBGA, etc., is an advanced semiconductor packaging technology, characterized by the use of a package substrate to accommodate a semiconductor element, with solder balls arranged in a grid array on a back side of the package substrate. The entire packaging unit is electrically connected to external electronic device(s) through the soldering of these solder balls, so that the same area of the unit on the carrier is able to accommodate more input/output (I/O) connections in order to meet the need for high integration of the semiconductor chips.

Furthermore, in order to be in line with the development in the directions of compact, light, versatile, high-speed and high-frequency semiconductor packages, the development of chips has been focused on areas of fine lines and small aperture.

As shown in FIG. 1, a traditional flip-chip semiconductor package 1 includes a semiconductor chip 13 disposed on a packaging substrate 10. More specifically, the packaging substrate 10 includes a plurality of electrical contact pads 11, and the packaging substrate 10 and the electrical contact pads 11 are covered with an insulating protection layer 12. The insulating protection layer 12 has a plurality of openings 120 for exposing the corresponding electrical contact pads 11, such that a plurality of solder bumps 14 are joined with the electrical contact pads 11 in the various openings 120, allowing reflow of the various solder bumps 14 in order to connect with the semiconductor chip 13.

However, in subsequent heating process, the volume of the solder bumps 14 will increase by about 30 to 50%, such that some of the soldering materials 140 of the solder bumps 14 may seep into the space between the insulating protection layer 12 and the electrical contact pads 11 or between the insulating protection layer 12 and the packaging substrate 10, resulting in solder extrusion. When the bump pitch between two adjacent electrical contact pads 11 is small, the phenomenon of bridging tends to happen, causing short circuits and decreasing product yield.

In order to avoid the above phenomenon of bridging caused by solder extrusion, a metal layer can be formed above the electrical contact pads 11 to stop the permeation of the soldering materials 140. More specifically, as shown in FIG. 1', a packaging substrate 10 includes a base 10a and a circuit structure 10b disposed on the base 10a, wherein electrical contact pads 11 and a plurality of conductive traces 100 are disposed on the circuit structure 10b, and a metal layer 15 is formed on the electrical contact pads 11 in order to bond the solder bumps 14, wherein the metal layer 15 includes Ni/Pd/Au. The metal layer 15 prevents the soldering materials from seeping between the insulating protection layer 12 and the electrical contact pads 11 or between the insulating protection layer 12 and the packaging substrate 10 during reflow of the solder bumps 14.

However, the method of using the metal layer 15 to cut off the soldering materials will inevitably increase the manufacturing cost of the packaging substrate 10 by 10% to 25%. This is not economical.

Therefore, there is a need for a solution that addresses the aforementioned issues in the prior art.

SUMMARY

In view of the aforementioned shortcomings of the prior art, the present disclosure provides a substrate structure, which may include: a substrate body; a plurality of electrical contact pads disposed on the substrate body, wherein at least one of the electrical contact pads includes at least one concave portion; a filling material formed in the concave portion; and an insulating protection layer formed on the substrate body and the filling material, wherein the insulating protection layer includes a plurality of openings exposing the electrical contact pads.

In the above substrate structure, the insulating protection layer further includes at least one hole in communication with the concave portion. For example, the filling material is formed in the hole.

In the above substrate structure, the filling material is integrally formed with the insulating protection layer.

The present disclosure also provides a method for manufacturing a substrate structure, which may include: providing a substrate body including a plurality of electrical contact pads; forming an insulating protection layer on the substrate body and the electrical contact pads, wherein the insulating protection layer includes a plurality of openings exposing the electrical contact pads; forming at least one hole on the insulating protection layer, wherein the hole extends into at least one electrical contact pad to form at least one concave portion on the electrical contact pad in the hole; and forming a filling material in the concave portion.

In the aforementioned method, the filling material is further formed in the hole.

The present disclosure further provides a method for manufacturing a substrate structure, which may include: providing a substrate body including a plurality of electrical contact pads, wherein at least one of the electrical contact pads includes at least one concave portion; forming an insulating protection layer on the substrate body; and forming a filling material in the concave portion, wherein the insulating protection layer includes a plurality of openings exposing the plurality of electrical contact pads.

In the aforementioned method, the filling material is integrally formed with the insulating protection layer.

In the aforementioned substrate structure and the methods, the concave portion penetrates the electrical contact pad. In another embodiment, the concave portion is free from penetrating the electrical contact pad.

In the aforementioned substrate structure and the methods, the insulating protection layer is composed of a material different from or the same as the filling material.

The aforementioned methods further include forming a plurality of conductive elements on the electrical contact pads in the plurality of openings to bond an electronic element. For example, the conductive elements contain soldering materials.

In the aforementioned substrate structure and the methods, the filling material is a metal material or an insulating material. For example, the insulating material is an underfill, a molding compound, a solder resistant material, polybenzoxazole (PBO), polyimide (PI), or benezocy-clobutene (BCB).

In the aforementioned substrate structure and the methods, the concave portion is at a corner of the substrate body.

It can be understood from the above that the substrate structure and the methods of the present disclosure essentially includes forming concave portions in which a filling material is filled on the electrical contact pads, such that the filling material prevents the soldering materials from permeating along the interfaces of the insulating protection layer and the electrical contact pads, thereby eliminating the phenomenon of solder extrusion. Thus, compared to the prior art, bridging in the substrate structures can be eliminated even when the bump pitch between two adjacent electrical contact pads is small. As a result, short circuits can be prevented, and production yield can be increased.

Moreover, the substrate structure of the present disclosure does not need an additional metal layer formed on the electrical contact pads as required in the prior art, thereby reducing the manufacturing cost of the substrate structure.

BRIEF DESCRIPTION OF THE DRAWINGS

The present disclosure can be more fully understood by reading the following detailed description of the preferred embodiments, with reference made to the accompanying drawings, wherein:

FIG. 1' is a cross-sectional diagram illustrating a portion of another traditional semiconductor package;

FIGS. 2A to 2C are cross-sectional diagrams illustrating a method for manufacturing a substrate structure in accordance with a first embodiment of the present disclosure, wherein FIG. 2B' is another embodiment of FIG. 2B; FIG. 2B" is a partial top view of FIG. 2B'; FIG. 2C' is another embodiment of FIG. 2C; and FIG. 2C" is a partial top view of FIG. 2C;

DETAILED DESCRIPTION OF THE EMBODIMENTS

Figure 1:
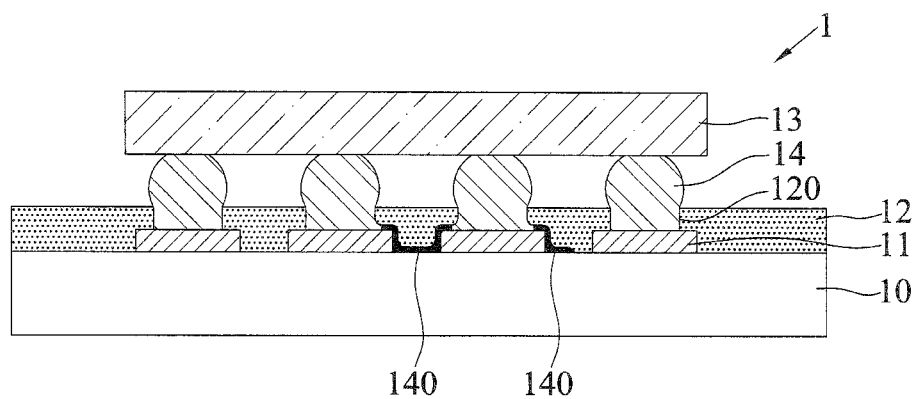
FIG. 1 is a cross-sectional diagram illustrating a traditional semiconductor package.
Figure 1:
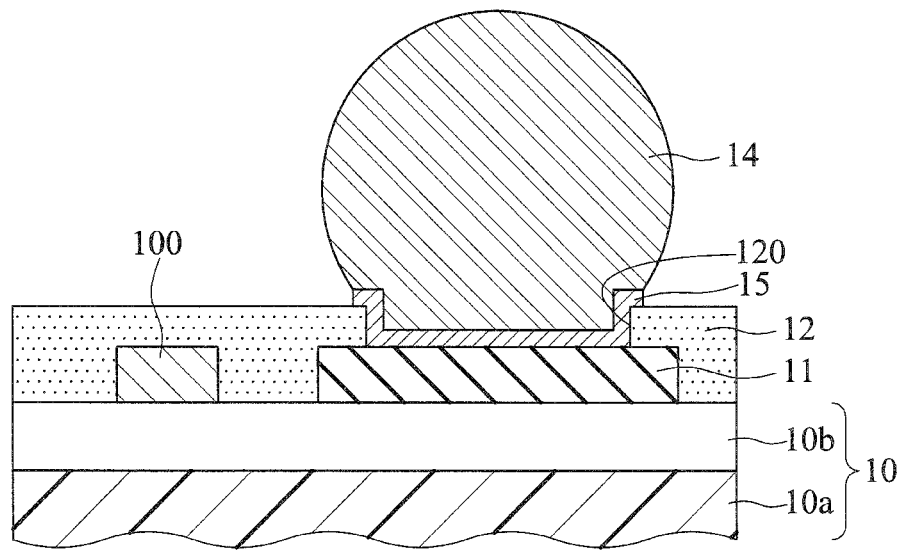

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "up", "down", "bottom", "first", "second", "a" and the like, are for illustrative purposes only, and are not meant to limit the range implementable by the present disclosure. Any changes or adjustments made to their relative relationships, without modifying the substantial technical contents, are also to be construed as within the range implementable by the present disclosure.

FIGS. 2A to 2C are cross-sectional diagrams illustrating a method for manufacturing a substrate structure 2 in accordance with a first embodiment of the present disclosure.

As shown in FIG. 2A, a substrate body 20 including a plurality of electrical contact pads 21 is provided, and an insulating protection layer 22 is formed on the substrate body 20 and the electrical contact pads 21.

In this embodiment, the substrate body 20 is a circuit structure. For example, the substrate body 20 can be a circuit board having a plurality of dielectric layers and a plurality of circuit layers, and the electrical contact pads 21 are electrically connected with conductive traces 200. The electrical contact pads 21 and the conductive traces 200 form the outermost circuit layer, which is disposed on top of the outermost dielectric layer and electrically connected with other circuit layers. The material used for forming the dielectric layers can be prepreg materials.

Furthermore, in another embodiment, the substrate body may include a base and a circuit structure disposed on the base, and electrical contact pads 21 and conductive traces 200 are disposed on the circuit structure. The base can, for example, be a semiconductor substrate, such as a wafer, a chip, an interposer with Through-Silicon Vias (TSVs). The circuit structure includes a plurality of dielectric layers and a plurality of redistribution layers (RDLs), wherein the electrical contact pads 21 and the conductive traces 200 are provided on the outermost dielectric layer and electrically connected with other circuit redistribution layers. Alternatively, the electrical contact pads 21 and the conductive traces 200 are part of a circuit redistribution layer.

Moreover, the insulating protection layer 22 includes a plurality of openings 220 for exposing the corresponding electrical contact pads 21. More specifically, the material for the insulating protection layer 22 can be a solder resistant material or a dielectric material, wherein the dielectric material can, for example, be polyimide (PI), benezocy-clobutene (BCB) or polybenzoxazole (PBO).

As shown in FIG. 2B, a plurality of holes 221 are formed in the insulating protection layer 22. These holes 221 extend into the electrical contact pads 21, such that at least one concave portion 210 is formed on the electrical contact pad 21 in each hole 221, wherein these holes 221 are at the periphery of the openings 220.

In this embodiment, the hole 221 and the concave portion 210 are in communication with each other. For example, a hole 221 and a concave portion 210 are formed by laser simultaneously, such that the shape of the hole 221 matches that of the concave portion 210. It can be understood that the holes 221 and the concave portions 210 can be formed by etching.

In addition, the concave portion 210 penetrates the electrical contact pad 21, such that the surface of the substrate body 20 is exposed from the concave portion 210. Alternatively, a concave portion 210' does not penetrate the electrical contact pad 21, as shown in FIG. 2B'. For example, the thickness of the electrical contact pad 21 is about 25 µm, and the depth (i.e., the depth of the laser drill hole) of the concave portion 210' is about 10 to 15 µm.

Moreover, the concave portions 210 and 210' are at the edge of the electrical contact pads 21, and the planar shape of the electrical contact pads 21 viewed from the top can be various geometric shapes. For example, as shown in FIG. 2B'', when the planar shape of the electrical contact pad 21 viewed from the top is a circle, then the planar shape of the concave portion 210 may, for example, be a ring shape, a ring shape with a gap or arcs with at least two intervals. Thus, there can be various shapes and forms for the electrical contact pads 21 and the concave portions 210 and 210', and the present disclosure is not limited to the abovementioned.

In addition, the width of the hole 221 (or the width of the concave portion 210 or 210') may be 5 to 25 µm, as shown in FIG. 2B'.

As shown in FIG. 2C, filling materials 23 is formed in the concave portion 210 and the holes 221, thereby forming the substrate structure 2.

In this embodiment, the filling materials 23 are made of the same or different material as the insulating protection layer 22, that is, any material can be used as the filling materials 23 as long as they blocks the flow of the soldering material, such as a metal material or an insulating material; the present disclosure is not limited as such.

Moreover, a substrate structure 2' shown in FIG. 2C' can be obtained if the manufacturing process is continued from FIG. 2B'.

Figure 3A:
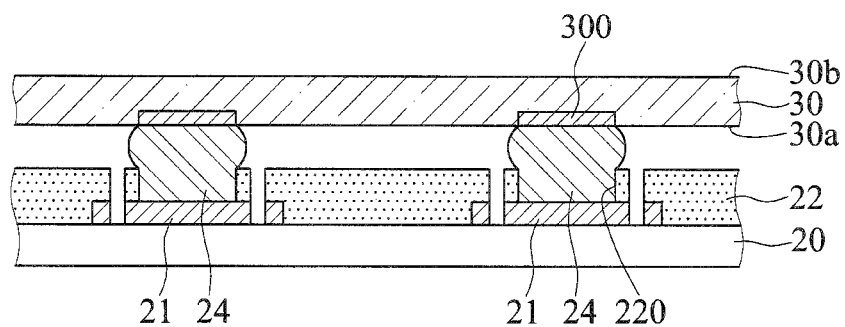
FIGS. 3A and 3B are cross-sectional diagrams illustrating a method for manufacturing a substrate structure in accordance with a second embodiment of the present disclosure.
Figure 3B:
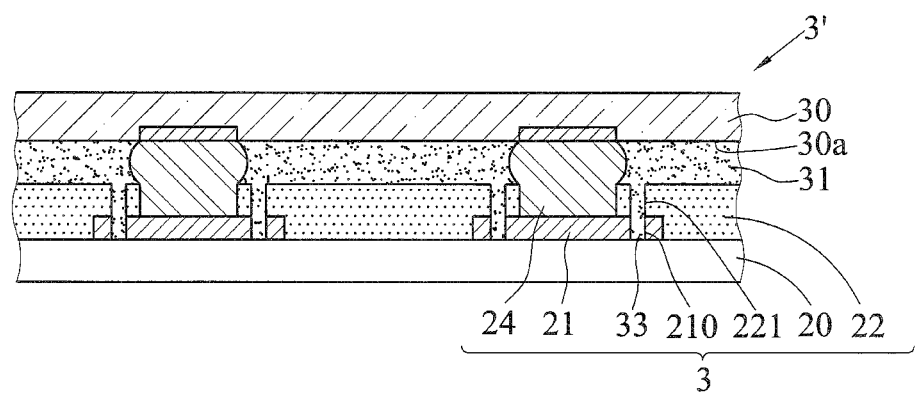

FIGS. 3A and 3B are cross-sectional diagrams illustrating a method for manufacturing a substrate structure 3 in accordance with a second embodiment of the present disclosure. The method of this embodiment is described from the manufacturing process in FIG. 2B, that is, the method is the same up until the stage described in FIG. 2B, and the differences are illustrated below.

As shown in FIG. 3A, a plurality of conductive elements 24 containing soldering materials are formed on the electrical contact pads 21 in the openings 220, so as to bond an electronic element 30 via the conductive elements 24, wherein each of the conductive elements 24 is electrically connected with a corresponding electrical contact pad 21.

In this embodiment, the electronic element 30 is an interposer with TSVs, a circuit board, an active component, a passive component or a combination thereof, wherein the active component can be, for example, a semiconductor chip or a wafer, and the passive component can be, for example, a resistor, a capacitor or an inductor. As an example, the electronic element 30 is an active component, which includes an active surface 30a and a non-active surface 30b opposite to each other. The active surface 30a includes a plurality of electrode pads 300, so that the electronic element 30 is bonded to the conductive elements 24 through corresponding electrode pads 300.

Moreover, the conductive elements 24 can be solder bumps, copper bumps coated with soldering materials or any other bumps containing solder materials.

As shown in FIG. 3B, filling materials 33 are formed in the concave portions 210 and the holes 221, and an encapsulating layer 31 is formed between the active surface 30a of the electronic element 30 and the insulating protection layer 22, thereby producing an electronic package 3'.

In this embodiment, the filling materials 33 and the encapsulating layer 31 are integrally formed. For example, the filling materials 33 and the encapsulating layer 31 are formed by the same filling process or molding process, so the material of the filling materials 33 and the material of the encapsulating layer 31 are the same. For example, they are both formed of underfill or molding compound (e.g., epoxy resin).

Figure 4A:
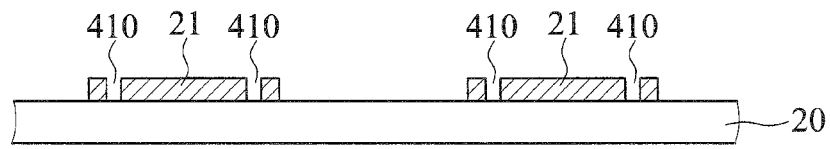
FIGS. 4A and 4B are cross-sectional diagrams illustrating a method for manufacturing a substrate structure in accordance with a third embodiment of the present disclosure.
Figure 4B:
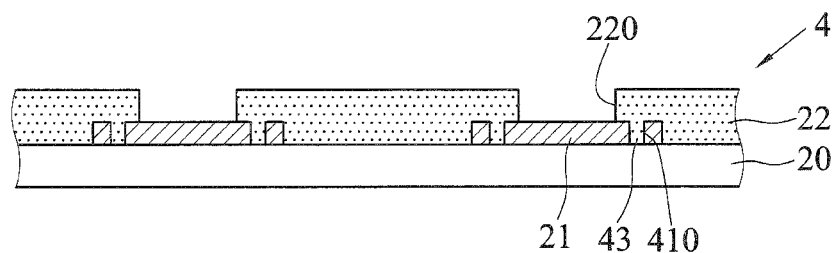

FIGS. 4A and 4B are cross-sectional diagrams illustrating a method for manufacturing a substrate structure 4 in accordance with a third embodiment of the present disclosure. The difference between this embodiment and the last embodiment is in the manufacturing process of the concave portion, so the differences are illustrated below, while same parts are not repeated.

As shown in FIG. 4A, a substrate body 20 including electrical contact pads 21 is provided, and the electrical contact pads 21 have a plurality of concave portions 410.

In this embodiment, concave portions 410 are formed in the electrical contact pads 21 by etching or laser process. It can be understood that electrical contact pads 21 with concave portions 410 can be formed directly by electroplating or coating. Moreover, the concave portions 410 can be chosen to penetrate or not penetrate the electrical contact pads 21.

As shown in FIG. 4B, an insulating protection layer 22 is formed on the substrate body 20, and a plurality of filling materials 43 are formed in the concave portions 410.

In this embodiment, the insulating protection layer 22 has a plurality of openings 220 for exposing corresponding electrical contact pads 21.

Moreover, the filling materials 43 and the insulating protection layer 22 are formed integrally. For example, the filling materials 43 and the insulating protection layer 22 are formed by the same coating process, so the materials of the filling materials 43 and the insulating protection layer 22 are the same. For example, they are both made of a dielectric material or a solder resistant material. Alternatively, the filling materials 43 and the insulating protection layer 22 can be made of the same material but separately. It can be understood that the filling materials 43 and the insulating protection layer 22 can also be made of different materials and made separately.

In the substrate structures 2, 2', 3 and 4 of the present disclosure, concave portions 210, 210' and 410 are formed on the electrical contact pads 21, such that filling materials 23, 33 and 43 are formed in the concave portions 210, 210' and 410, so in the subsequent heating process, the flow of the soldering materials of the conductive elements 24 are blocked by the filling materials 23, 33 and 43, preventing the soldering materials of the conductive elements 24 from permeating along the interfaces of the insulating protection layer 22 and the electrical contact pads 21. Thus, bridging in the substrate structures 2, 2', 3 and 4 can be eliminated even when the bump pitch between two adjacent electrical contact pads 21 is small, avoiding short circuits. Thus, compared to the prior art, the substrate structures 2, 2', 3 and 4 of the present disclosure are in line with the developments towards more compact, lighter, more versatile, higher speed and higher frequency semiconductor chips, and production yield can be increased.

Moreover, since the substrate structures 2, 2', 3 and 4 of the present disclosure do not require forming a solder material blocking layer (metal layer) on the electrical contact pads 21 as described in the prior art, the manufacturing cost of the substrate structures 2, 2', 3 and 4 can thus be effectively controlled, and is cost effective.

In addition, in the substrate structures 2, 2', 3 and 4 of the present disclosure, the concave portions 210 can be formed on all of the electrical contact pads 21. However, it can be understood that the concave portions 210 can be formed only where the bump pitch is smaller or stress is higher (e.g., at the four corners of the substrate body 20), as shown in FIG. 2C", further reducing the production time and cost.

The present disclosure further provides a substrate structure 2, 2', 3 or 4, including a substrate body 20, a plurality of electrical contact pads 21, a filling material 23, 33 or 43, and an insulating protection layer 22 formed on the substrate body 20 and the filling material 23, 33 or 43.

The electrical contact pads 21 are formed on the substrate body 20, wherein at least one electrical contact pad 21 includes at least one concave portion 210, 210' or 410.

The filling material 23, 33 or 43 is formed in the concave portion 210, 210' or 410.

The insulating protection layer 22 includes a plurality of openings 220 for exposing corresponding electrical contact pads 21.

In one embodiment, the insulating protection layer 22 further includes holes 221 in communication with the concave portion 210 or 210', and the filling materials 23 or 33 are formed in the holes 221.

In one embodiment, the material of the filling material 23 or 33 is different from that of the insulating protection layer 22.

In one embodiment, the material of the filling material 23 or 43 is the same as that of the insulating protection layer 22.

In one embodiment, the filling material 43 is integrally formed with the insulating protection layer 22.

In one embodiment, the substrate structure 3 further includes a plurality of conductive elements 24 disposed on the electrical contact pads 21 of the openings 220 for combining with an electronic element 30.

In one embodiment, the material of the filling material 33 can be made integrally with and of the same material as an encapsulating layer 31 formed between the electronic element 30 and the insulating protection layer 22.

In one embodiment, the material of the filling material 23, 33 or 43 can be a metal material or an insulating material, and the insulating material can be an underfill, a molding compound, a solder resistant material, polybenzoxazole (PBO), polyimide (PI), or benezocy-clobutene (BCB).

In summary, the substrate structure and the manufacturing for the substrate structure of the present disclosure avoids the phenomenon of solder extrusion through the use of the concave portions and the filling materials. As a result, the substrate structure of the present disclosure has the development potential of being compact, multi-functional and with high speed and high frequency, and production yield can be increased while the manufacturing cost of the substrate structure can be effected controlled.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. A substrate structure comprising:
a substrate body;
a plurality of electrical contact pads disposed on the substrate body, wherein at least one of the plurality of electrical contact pads has at least one concave portion formed inside a periphery of the at least one of the plurality of electrical contact pads;
a filling material formed in the at least one concave portion; and
an insulating protection layer formed on the substrate body, the insulating protection layer including a plurality of openings corresponding to the plurality of electrical contact pads,
wherein a bottom of at least one of the plurality of openings is made from the at least one of the plurality of electrical contact pads,
the insulating protection layer further includes at least one hole in communication with the at least one concave portion and free from being in communication with the plurality of openings, and
the filling material is located outside the plurality of openings and in the at least one hole.

2. The substrate structure of claim 1, wherein the at least one concave portion penetrates the at least one of the plurality of electrical contact pads.

3. The substrate structure of claim 1, wherein the at least one concave portion is free from penetrating the at least one of the plurality of electrical contact pads.

4. The substrate structure of claim 1, wherein the insulating protection layer is composed of a material different from the filling material.

5. The substrate structure of claim 1, wherein the insulating protection layer is composed of a material the same as the filling material.

6. The substrate structure of claim 1, wherein the filling material is integrally formed with the insulating protection layer.

7. The substrate structure of claim 1, wherein the filling material is a metal material or an insulating material.

8. The substrate structure of claim 7, wherein the insulating material is an underfill, a molding compound, a solder resistant material, polybenzoxazole (PBO), polyimide (PI), or benezocy-clobutene (BCB).

9. The substrate structure of claim 1, further comprising a plurality of conductive elements disposed on the plurality of electrical contact pads exposed from the openings to bond an electronic element.

10. The substrate structure of claim 9, wherein the conductive elements contain soldering materials.

11. The substrate structure of claim 1, wherein the at least one concave portion is formed on the at least one of the plurality of the electrical contacts pads located at a corner of the substrate body.

* * * * *